(12) United States Patent  
Koyama et al.

(10) Patent No.: US 11,560,619 B2  
(45) Date of Patent: Jan. 24, 2023

(54) LAMINATE AND METHOD OF PRODUCING THE SAME, AND GAS BARRIER FILM AND METHOD OF PRODUCING THE SAME

(71) Applicant: TOPPAN PRINTING CO., LTD., Tokyo (JP)

(72) Inventors: Hiroshi Koyama, Tokyo (JP); Jin Sato, Tokyo (JP); Mitsuru Kano, Tokyo (JP)

(73) Assignee: TOPPAN PRINTING CO., LTD., Tokyo (JP)

(*) Notice: Subject to any disclaimer, the term of this patent is extended or adjusted under 35 U.S.C. 154(b) by 148 days.

(21) Appl. No.: 16/990,364

(22) Filed: Aug. 11, 2020

(65) Prior Publication Data

US 2020/0370165 A1    Nov. 26, 2020

Related U.S. Application Data

(60) Division of application No. 15/704,228, filed on Sep. 14, 2017, now abandoned, which is a continuation of  
(Continued)

(51) Int. Cl.  
*B32B 9/00* (2006.01)  
*C23C 16/40* (2006.01)  
(Continued)

(52) U.S. Cl.  
CPC ............... *C23C 14/20* (2013.01); *B32B 9/00* (2013.01); *C23C 14/0036* (2013.01);  
(Continued)

(58) Field of Classification Search  
CPC ....... C23C 14/20; C23C 14/083; C23C 14/34; C23C 16/402; C23C 16/405;  
(Continued)

(56) References Cited

U.S. PATENT DOCUMENTS

2006/0134433 A1    6/2006   Maula et al.  
2010/0015431 A1*   1/2010   Matsui ................... B32B 33/00  
                                                              428/323

(Continued)

FOREIGN PATENT DOCUMENTS

EP        1674890 A2      6/2006  
JP        2007-516347 A   6/2007  
(Continued)

OTHER PUBLICATIONS

International Search Report issued in International Application No. PCT/JP2016/001509 dated May 31, 2016.  
(Continued)

*Primary Examiner* — Daniel J. Schleis  
*Assistant Examiner* — Kevin Ct Li  
(74) *Attorney, Agent, or Firm* — Foley & Lardner LLP

(57) ABSTRACT

A laminate that improves barrier properties of an atomic layer deposition film in spite of use of a substrate made of a polymer material, and provides a gas barrier film and a method of producing the same. The laminate includes: a substrate made a polymer material; an undercoat layer disposed on at least part of a surface of the substrate and made up of an inorganic material containing Ta; and an atomic layer deposition film disposed so as to cover a surface of the undercoat layer.

7 Claims, 2 Drawing Sheets

Related U.S. Application Data application No. PCT/JP2016/001509, filed on Mar. 16, 2016.

(51) Int. Cl.

| | |
|---|---|
| *C23C 14/20* | (2006.01) |
| *C23C 28/04* | (2006.01) |
| *C23C 16/54* | (2006.01) |
| *C23C 14/00* | (2006.01) |
| *C23C 16/455* | (2006.01) |
| *C23C 16/02* | (2006.01) |
| *C23C 14/08* | (2006.01) |
| *C23C 14/34* | (2006.01) |

(52) U.S. Cl.
CPC ............ *C23C 14/083* (2013.01); *C23C 14/34* (2013.01); *C23C 16/0272* (2013.01); *C23C 16/40* (2013.01); *C23C 16/402* (2013.01); *C23C 16/403* (2013.01); *C23C 16/405* (2013.01); *C23C 16/4554* (2013.01); *C23C 16/45525* (2013.01); *C23C 16/45555* (2013.01); *C23C 16/545* (2013.01); *C23C 28/04* (2013.01)

(58) Field of Classification Search
CPC .............. C23C 16/545; C23C 16/4554; C23C 16/0272; C23C 16/403; C23C 16/45555; C23C 16/45525; C23C 16/40; C23C 28/04; B32B 9/00

See application file for complete search history.

(56) References Cited

U.S. PATENT DOCUMENTS

2014/0370260 A1* 12/2014 Uebayashi ............ C23C 14/10
428/218
2015/0132587 A1    5/2015 Nishio

FOREIGN PATENT DOCUMENTS

| JP | 2012-182303 A | 9/2012 |
| JP | 2014-087931 A | 5/2014 |
| WO | WO-2013/015412 A1 | 1/2013 |
| WO | WO-2014/156932 A1 | 10/2014 |

OTHER PUBLICATIONS

Extended European Search Report dated Oct. 17, 2018 in corresponding application No. 16764495.4.

* cited by examiner

LAMINATE AND METHOD OF PRODUCING THE SAME, AND GAS BARRIER FILM AND METHOD OF PRODUCING THE SAME

CROSS-REFERENCE TO RELATED PATENT APPLICATIONS

This application is a Divisional of U.S. patent application Ser. No. 15/704,228, filed on Sep. 14, 2017, which is a Bypass Continuation Application filed under 35 U.S.C. § 111(a) claiming the benefit under 35 U.S.C. §§ 120 and 365(c) of International Application No. PCT/JP2016/001509, filed on Mar. 16, 2016, which is based upon and claims the benefit of priority of Japanese Patent Application No. 2015-053395, filed on Mar. 17, 2015. The entire contents of each of these patent applications are hereby incorporated by reference in their entireties.

TECHNICAL FIELD

The present invention relates to a laminate and a method of producing the same, and a gas barrier film and a method of producing the same. More specifically, the present invention relates to a laminate including a substrate made of a polymer and a method of producing the laminate, and a gas barrier film including the laminate and a method of producing the gas barrier film.

BACKGROUND

Methods for forming a thin film on the surface of an object using a gaseous phase in which substances can move at an atomic or molecular level like gases include chemical vapor deposition (CVD) method (hereinafter, referred to as "CVD") and physical vapor deposition (PVD) (hereinafter, referred to as "PVD").

PVD includes, for example, vacuum vapor deposition and sputtering. Sputtering, which enables production of a high-quality thin film with a uniform film quality and thickness, has been commonly applied to display devices such as liquid crystal displays.

CVD is a process of growing a solid thin film by introducing raw material gas into a vacuum chamber and decomposing or reacting one or two types of gas on a substrate by means of thermal energy.

In this process, a plasma or catalyst reaction may also be used in order to promote a reaction during film formation or decrease the reaction temperature.

CVD using a plasma reaction is called plasma enhanced CVD (PECVD). Further, CVD using a catalyst reaction is called Cat-CVD.

These CVD processes can reduce deficiencies in film formation, and are therefore applied to a production process of semiconductor devices or the like (for example, formation of a gate insulating film).

In recent years, atomic layer deposition (ALD) (hereinafter, referred to as "ALD") has been attracting attention.

ALD is a process in which a substance adsorbed on a surface is deposited layer by layer at an atomic level by means of a chemical reaction on the surface. This ALD is classified as a type of CVD.

Typical CVD (general CVD) is a process of growing a thin film by reacting a single gas or a plurality of gases simultaneously on a substrate. On the other hand, ALD is a specific process of deposition for growing thin films at an atomic level layer by layer by means of adsorption on the substance surface and subsequent chemical reaction by alternately using a highly active gas or precursor (such as tri-methyl aluminum (TMA); hereinafter, "first precursor") and a reactive gas.

Specifically, film formation by ALD is conducted as follows.

First, when precursors have been adsorbed onto the substrate to form only one layer, unreacted precursors are purged by using a so-called self-limiting effect (first step).

Here, the self-limiting effect refers to a phenomenon during surface adsorption on a substrate that gas is no longer adsorbed onto a surface once the surface is covered by a certain type of gas.

Then, a reactive gas is introduced into a chamber to oxidize the above precursors to form only one layer of a thin film having a desired composition, and then the reactive gas is purged (second step).

In ALD, the above first and second steps are taken as one cycle, which is repeated to grow thin films on the substrate.

Accordingly, ALD grows thin films in two dimensions. Further, ALD is characterized in reducing deficiencies in film deposition compared with a typical CVD process as well as the conventional vacuum vapor deposition or sputtering.

Accordingly, ALD is expected to be widely applied to packaging fields such as foods and pharmaceutical products, electronics fields, and the like.

PTL 1 discloses a product comprising a substrate made of a material selected from the group consisting of a plastic and a glass, and a gas transmission barrier deposited on the substrate by atomic layer vapor deposition.

Further, PTL 1 discloses that a light emitting polymer is mounted on a plastic substrate having optical transparency, and atomic layer vapor deposition is performed on a top and side surfaces of the light emitting polymer by means of ALD (top coating), thereby achieving reduction in coating deficiencies and drastically reducing gas permeability for the thickness of several tens of nanometers.

When an atomic layer deposition film is formed on a substrate made of a polymer material by means of ALD, it seems there is a possibility that the form of growth is different from that in film formation on a substrate made of an inorganic crystal such as Si wafer.

When a Si wafer having an oxidation treated surface is used as a substrate and an atomic layer deposition film is formed on the substrate by means of ALD, adsorption sites for precursors which serve as raw materials of the atomic layer deposition film are present at substantially the same density as the lattice of crystal, and growth of the film proceeds in a two dimensional growth mode.

On the other hand, when an atomic layer deposition film is formed on the substrate made of a polymer material by means of ALD, it has been known that adsorption sites for precursors which serve as raw materials of the atomic layer deposition film are present at a low distribution density, and the adsorption sites grow in three dimensions around nuclei, which are the adsorbed precursors separated from each other, so that the adjacent nuclei are in contact with each other to form a continuous layer.

Depending on the state of the substrate made of a polymer material and the process condition of ALD, there is a high possibility that a continuous layer is not formed.

That is, when an atomic layer deposition film is formed on the substrate made of a polymer material by means of ALD, there is a risk that gas may pass through a plurality of gaps that constitute the atomic layer deposition film from the surface of the atomic layer deposition film toward the substrate.

In other words, when the atomic layer deposition film is formed on the substrate made of a polymer material by means of ALD, there is a risk that the atomic layer deposition film does not have the desired gas barrier properties.

A technique for solving such a problem is disclosed in PTL 2.

PTL 2 discloses formation of an undercoat layer containing an organic polymer by using an organic binder containing an inorganic material on a substrate (surface of the substrate) made of a polymer material.

CITATION LIST

Patent Literature

PTL 1: JP 2007-516347 A
PTL 2: WO 2013/015412

SUMMARY OF THE INVENTION

Technical Problem

The present inventors studied the technique disclosed in PTL 2 as a preliminary study for the present invention and found that the technique disclosed in PTL 2 is not sufficient for obtaining sufficient gas barrier properties.

Accordingly, the present invention has an object to provide a laminate that improves barrier properties of an atomic layer deposition film in spite of use of a substrate made of a polymer material, and to provide a gas barrier film and a method of producing the same.

Solution to Problem

In the technique disclosed in PTL 2, sufficient gas barrier properties cannot be obtained since it is difficult to form many adsorption sites in a region in which an organic polymer is disposed on the surface of the substrate made of a polymer material.

Further, the present inventors have presumed the reason for sufficient adsorption sites not being obtained is that a free volume present in the organic polymer causes an insufficient density of the adsorption sites, and two dimensional growth does not start until the free volume is filled with the precursors.

In particular, sufficient gas barrier properties are not obtained when the atomic layer deposition film is thin.

The present invention provides a laminate that improves barrier properties of an atomic layer deposition film by providing adsorption sites for precursors of the atomic layer deposition film at a sufficient density on the surface of the undercoat layer made of a polymer material and disposed on the substrate, on which the atomic layer deposition film is disposed, and a method of producing the same, and provides a gas barrier film and a method of producing the same.

That is, in order to solve the problem, a laminate according to an aspect of the present invention is characterized in that it includes: a substrate made of a polymer material; an undercoat layer disposed on at least part of a surface of the substrate and made of an inorganic material containing elemental Ta; and an atomic layer deposition film disposed on at least part of a surface of the undercoat layer.

Further, a gas barrier film according to an aspect of the present invention is characterized in that it includes the laminate according to the above aspect of the present invention, wherein the substrate that constitutes the laminate is a film-shaped substrate.

Further, a method of producing a laminate according to an aspect of the present invention is characterized in that it includes the steps of: forming an undercoat layer by using an inorganic material containing elemental Ta on at least part of a surface of a substrate made of a polymer material disposed in a vacuum chamber; and forming an atomic layer deposition film by supplying a precursor serving as a raw material for deposition on at least part of the surface of the undercoat layer.

A method of producing a gas barrier film according to an aspect of the present invention may include the method of producing a laminate, wherein a film-shaped substrate may be used as the substrate.

Advantageous Effects of Invention

According to the present invention, barrier properties of an atomic layer deposition film are improved since adsorption sites to which precursors serving as raw materials for deposition of the atomic layer deposition film can be provided at a sufficient density on the surface of the undercoat layer made of a polymer material and disposed on the substrate, on which the atomic layer deposition film is disposed.

DESCRIPTION OF REPRESENTATIVE EMBODIMENTS

With reference to the drawings, an embodiment of the present invention will be described in detail.

The drawings used in the following description are provided for describing a configuration of embodiments of the present invention, and the size, thickness, dimensions or the like of the illustrated components may be different from those of the actual laminate.

Outline of Embodiment

Figure 1:
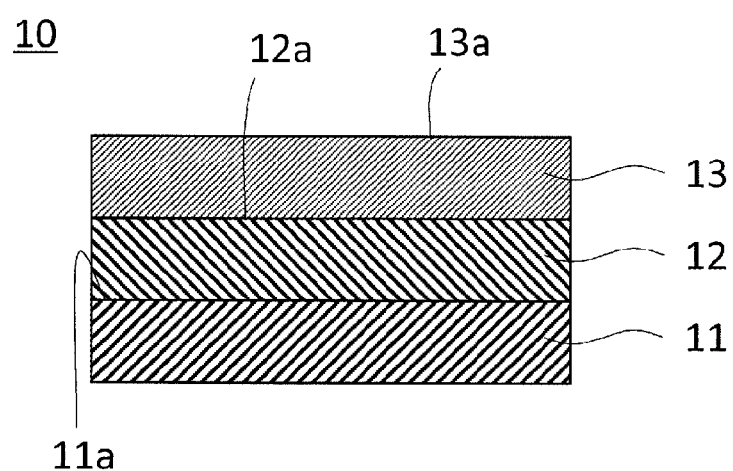
FIG. 1 is a cross sectional view which schematically shows a laminate according to an embodiment of the present invention.

FIG. 1 is a cross sectional view which schematically shows a laminate according to an embodiment of the present invention. In this embodiment, the description will be made by means of an example which uses a film-shaped substrate as a substrate 11 that constitutes a laminate 10.

The laminate 10 according to the present embodiment includes an undercoat layer 12 between the substrate 11 made of a polymer material and an atomic layer deposition film 13. The undercoat layer 12 includes binding sites for precursors serving as raw materials for deposition of the atomic layer deposition film 13, and is configured with an inorganic material containing elemental Ta.

Accordingly, a large number of adsorption sites (not shown) to which the above precursors contained in the atomic layer deposition film 13 are bound is provided on a surface 12a of the undercoat layer 12 at a high density compared with the undercoat layer made of an organic binder and inorganic material as disclosed in PTL 2 described above.

The precursors bound to the adsorption sites in the undercoat layer 12 are crosslinked to each other. Accordingly, the atomic layer deposition film 13 is formed in two dimensions in a plane direction of the undercoat layer 12, that is, a direction parallel to the surface 12a.

As a result, the atomic layer deposition film 13 is less likely to have a gap through which gas passes in a thickness direction of the laminate 10. This enables the atomic layer deposition film 13 having high gas barrier properties.

Moreover, an adhesive layer (for example, a resin layer containing an organic polymer), which is not shown in the figure, may be disposed between the substrate 11 and the undercoat layer 12. Providing the adhesive layer between the substrate 11 and the undercoat layer 12 enhances an adhesion strength between the substrate 11 and the undercoat layer 12.

Approach to the Present Invention

Typically, laminates having an atomic layer deposition film manufactured by atomic layer deposition (ALD) are commercially produced as electronic substrates such as those for thin-film wireless EL, displays, semiconductor memories (dynamic random access memory (DRAM)), glass substrates, and silicon substrates.

Meanwhile, a substrate of the laminate according to the present invention is a substrate made of a polymer material. However, processes of atomic layer deposition (ALD) for such a substrate have not been developed in detail compared with those for an electronic substrate.

Therefore, the present inventors attempted an approach to the laminate of the present invention while examining the growth process of the atomic layer deposition film on a substrate made of a polymer material based on the assumption that the growth of the atomic layer deposition film for forming the atomic layer deposition film on the surface of the substrate made of a polymer material is the same as the growth for forming the atomic layer deposition film on the electronic substrate.

In general, an atomic layer deposition film is considered to grow in two dimensions when the atomic layer deposition film is formed on the electronic substrate. However, the atomic layer deposition film does not actually grow in two dimensions when the atomic layer deposition film is formed on the substrate made of a polymer material (for example, polyethylene terephthalate (PET)).

In other words, in film formation of the atomic layer deposition film by means of ALD on the surface of the substrate made of a polymer material, there is a risk that two-dimensional growth originally expected in ALD may not be performed.

The major reasons for this are "the density of the adsorption sites" or "the types of adsorption sites" on the surface (a surface on which the atomic layer deposition film is formed) of the substrate 11 made of a polymer material.

If the atomic layer deposition film has a too small thickness, the atomic layer deposition film does not sufficiently exhibit barrier properties. Therefore, the thickness of the atomic layer deposition film is required to be 3 nm or more (in other words, the thickness of a 30-molecule layer or more).

The first reason, which is the density of the adsorption sites for precursor serving as a raw materials for deposition of the atomic layer deposition film, can be considered as follows.

In the first step of an ALD process, a gaseous precursor (for example, a metal-containing precursor such as trimethyl aluminum (TMA) or $TiCl_4$) is chemically adsorbed onto a surface of the substrate made of a polymer material (hereinafter, simply referred to as a "substrate").

In this process, it seems that the reactivity between the precursor and the inorganic material contained in the substrate, and the density of the adsorption sites have a significant effect on chemical adsorption.

If the density of the adsorption sites is low, the adsorption sites for precursors are arranged with a large space from each other. Thus, when the adsorption sites are arranged with a large space from each other, the atomic layer deposition film grows in three dimensions around the adsorption site, which serves as a nucleus.

That is, if the density of the adsorption sites is low, the atomic layer deposition film expands in three dimensions for precursors, and the precursors are sparsely adsorbed. As a consequence, the atomic layer deposition film grows around the isolated nucleus into a columnar shape.

Next, the second reason, which is the positions of adsorption sites (in other words, diffusion of precursors) can be considered as follows.

In general, polymer materials contain both crystalline regions and amorphous regions. In the amorphous regions, there is a space called a free volume in which polymer chains are not present. As a consequence, gas may be diffused or penetrate through the space.

Further, gaseous precursors also pass through the space of free volume until they are absorbed onto the adsorption site.

As described above, in film formation of the atomic layer deposition film on the surface 11a of the substrate 11 made of a polymer material by using ALD, precursors serving as raw materials for deposition of the atomic layer deposition film are diffused from the surface 11a to the inside of the substrate 11, and absorbed onto the adsorption sites which are sparsely present in three dimensions. Thus, the adsorption sites become the nuclei for the atomic layer deposition film.

Since the above nuclei are sparsely present in three dimensions, the growth proceeds in a three dimensional mode until the adjacent nuclei come into contact with each other to thereby form a continuous film, and then, the growth proceeds in a two dimensional mode.

Accordingly, when the atomic layer deposition film is formed on the surface 11a of the substrate 11 made of a polymer material by using ALD, a period of time from the start of forming process of the atomic layer deposition film to the formation of dense film by two dimensional growth becomes long.

As a result, if the thickness of the atomic layer deposition film is reduced, a dense portion formed by two dimensional growth in the atomic layer deposition film becomes extremely small.

In the atomic layer deposition film having the above configuration, gas barrier properties of the atomic layer deposition film become lower, and gas passes through gaps formed in the atomic layer deposition film.

Therefore, the present inventors have conceived the idea of providing an undercoat layer 12 having an inorganic substance containing elemental Ta on the surface 11a of the substrate 11 made of a polymer material, in order to achieve two points, that is, an increase in the density of the adsorption sites for precursors which are raw materials for deposition of the atomic layer deposition film and prevention of diffusion of precursors into the polymer substrate.

That is, in order to provide the adsorption sites for precursors which are raw materials for deposition of the atomic layer deposition film on the surface 11a of the substrate 11 made of a polymer material in two dimensions at a high density, an undercoat layer 12 having an inorganic material containing elemental Ta is provided on the surface 11a of the substrate 11 made of a polymer material prior to the processes of ALD.

Examples of the inorganic material containing elemental Ta include pure tantalum, tantalum oxide, tantalum nitride, and the like. That is, examples of the film that constitutes the undercoat layer 12 include pure tantalum, tantalum oxide, tantalum nitride, and the like.

Thus, the gas which contains precursors is prevented from passing through the undercoat layer 12 by providing the undercoat layer 12 having the inorganic material containing elemental Ta on the surface 11a of the substrate 11 made of a polymer material.

<Laminate>

With reference to FIG. 1, the laminate 10 of the present embodiment includes the substrate 11, the undercoat layer 12 and the atomic layer deposition film 13.

<Substrate>

The substrate 11 is made of a polymer material. The substrate 11 includes the surface 11a on which the undercoat layer 12 is formed.

Figure 2:
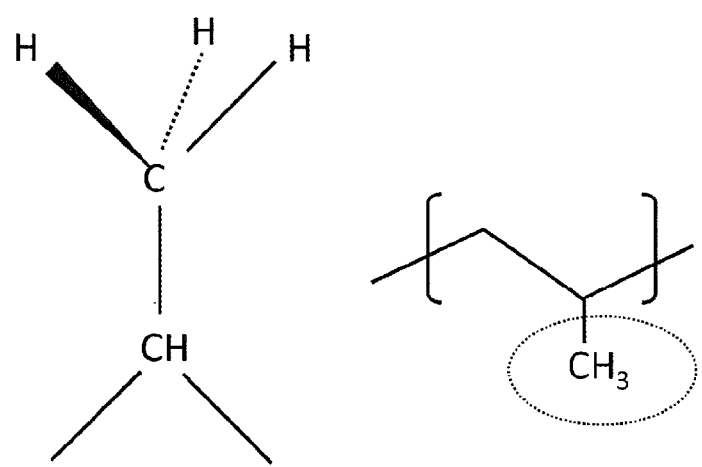
FIG. 2 is a view which shows a structural formula of a methyl group, which is an example of a functional group of the organic polymer which constitutes the substrate.
Figure 3:
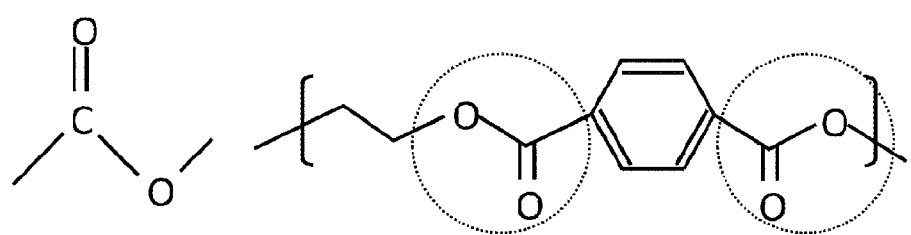
FIG. 3 is a view which shows a structural formula of an ester group, which is an example of a functional group of the organic polymer which constitutes the substrate.

FIG. 2 is a view which shows a structural formula of a methyl group, which is an example of a functional group of the organic polymer which constitutes the substrate 11. FIG. 3 is a view which shows a structural formula of an ester group, which is an example of a functional group of the organic polymer which constitutes the substrate 11.

Examples of the polymer material that constitutes the substrate 11 include polymer materials containing only hydrocarbon such as polyethylene (PE), or polypropylene (PP) or polystyrene (PS) having a methyl group (see FIG. 2) with poor nucleophilicity and less likely to bind with a precursor of a raw material for deposition of the atomic layer deposition film.

Further, examples of the polymer material that constitutes the substrate 11 include polymer materials which contain an O atom such as polyethylene terephthalate (PET), polyethylene naphthalate (PEN) and the like containing an ester group having nucleophilicity (see FIG. 3), an N atom of Nylon, polyimide (PI) and the like, and an S atom of polyethersulfone and the like.

The substrate 11 may be a substrate in a film shape (hereinafter, "film-shaped substrate"), or a substrate which is not in a film shape. When the laminate 10 is used for the barrier film, a film-shaped substrate may be used for the substrate 11.

When the film-shaped substrate is used, the thickness of the substrate 11 is preferably in the range of, for example, 12 to 300 µm. The thickness of less than 12 µm is not preferred since a fold or crease is likely to occur when the film is transported by a roller or the like. The thickness of more than 300 µm is not preferred since the cost for the substrate increases. Further, the range between 50 and 100 µm is more preferred.

<Undercoat Layer>

The undercoat layer 12 is disposed to cover the surface 11a of the substrate 11. The undercoat layer 12 is formed of only an inorganic material containing elemental Ta.

That is, a large number of inorganic materials are provided on the surface 12a of the undercoat layer 12 compared with the surface of the undercoat layer formed by using an organic binder containing an inorganic material disclosed in PTL 2.

The inorganic material includes many adsorption sites (a portion to which precursors which are raw material for deposition of the atomic layer deposition film 13 are bound) compared with the organic material.

Accordingly, a large number of adsorption sites (not shown) to which the above precursors contained in the atomic layer deposition film 13 are bound is provided on a surface 12a of the undercoat layer 12 at a high density compared with the undercoat layer disclosed in PTL 2.

As a result, a period of time from the start of forming process of the atomic layer deposition film 13 to the formation of dense film by two dimensional growth becomes shorter than the conventional period of time, in other words, the undercoat layer 12 has a small amount of spaces which correspond to a free volume of the substrate 11 and the precursors which are raw material for deposition are difficult to enter the spaces. Accordingly, a dense portion formed by two dimensional growth in the atomic layer deposition film can be increased even if the thickness of the atomic layer deposition film 13 is reduced (for example, 0.5 nm), and thus sufficient gas barrier properties can be obtained even if the thickness of the atomic layer deposition film 13 is reduced.

Further, the inorganic material containing elemental Ta (for example, $Ta_2O_5$ formed by sputtering) has high water vapor barrier properties compared with the inorganic material which does not contain elemental Ta (for example, $SiO_{1.6}$ formed by electron beam vapor deposition). As seen from this, the undercoat layer containing elemental Ta has a smaller space which corresponds to the free volume of the substrate 11 compared with the inorganic material which does not contain elemental Ta. Therefore, even if the thickness of the atomic layer deposition film 13 is further reduced, sufficient gas barrier properties can be obtained. Further, the inorganic material containing elemental Ta is less likely to change depending on the external moisture and heat compared with the inorganic material which does not contain elemental Ta, and can protect the atomic layer deposition film 13 for a long period of time.

Preferably, the thickness of the undercoat layer 12 is, for example, in the range of 1 nm or more and 1000 nm or less. When the thickness of the undercoat layer 12 is less than 1 nm, the atomic layer deposition film 13 does not have sufficient water vapor barrier properties due to insufficient density of the adsorption sites. When the thickness of the undercoat layer 12 is more than 1000 nm, it is not preferred since the cost and time for film formation increase and the undercoat layer 12 may have cracks or deficiencies.

Further, the density of the adsorption sites can be increased by applying plasma etching or hydrolyzation on the surface 12a of the undercoat layer 12.

FIG. 1 illustrates an example in which the undercoat layer 12 is disposed to cover the entire surface 11a of the substrate 11. However, the undercoat layer 12 is only required to be disposed on at least part of the surface 11a of the substrate 11, and is not limited to the configuration shown in FIG. 1.

Further, although the undercoat layer 12 is disposed such that the surface 11a of the substrate 11 and the undercoat layer 12 are in contact with each other in the example described in FIG. 1, an adhesive layer which is not shown in the figure may be disposed between the substrate 11 and the undercoat layer 12. The adhesive layer is made of, for example, a resin layer containing an organic polymer.

Thus, the adhesive layer disposed between the substrate 11 and the undercoat layer 12 can enhance an adhesion strength between the substrate 11 and the undercoat layer 12.

<Atomic Layer Deposition Film>

The atomic layer deposition film 13 is disposed so as to cover at least part of the surface 12a of the undercoat layer 12.

The atomic layer deposition film 13 contains precursors (for example, a metal-containing precursor such as trimethyl aluminum (TMA) or $TiCl_4$), which is a raw material for deposition of the atomic layer deposition film 13. In addition, the precursors located on the surface 12a of the undercoat layer 12 are bound to the adsorption sites of the inorganic sub stance.

As the atomic layer deposition film 13, an inorganic oxide film containing inorganic oxides such as Al, Ti, Si, Zn and Sn, or a nitride film or oxynitride film containing such inorganic oxides can be used.

Alternatively, the atomic layer deposition film 13 may be an oxide film, nitride film, oxynitride film or the like containing other elements (such as Zr and Hf).

Considering the water vapor barrier properties, durability and cost, a film containing at least one of the elements Al, Si, and Ti (for example, the film described above) is preferably used for the atomic layer deposition film 13. Using a film containing such an element for the atomic layer deposition film 13 can achieve high water vapor barrier properties and high durability, and reduce the cost.

Preferably, the thickness of the atomic layer deposition film 13 is, for example, in the range of 0.5 nm or more and 200 nm or less. When the thickness of the atomic layer deposition film 13 is less than 0.5 nm, the atomic layer deposition film 13 does not have sufficient water vapor barrier properties from a view of manufacturing technology. When the thickness of the atomic layer deposition film 13 is over 200 nm, the cost and time for film formation increase, which is not desirable.

Accordingly, when the thickness of the atomic layer deposition film 13 is in the range of 0.5 nm or more and 200 nm or less, the atomic layer deposition film 13 with sufficient water vapor barrier properties can be obtained in a short period of time.

The laminate according to the present embodiment includes: a substrate 11 made of a polymer material; an undercoat layer 12 disposed on at least part of a surface 11a of the substrate 11 and made up of an inorganic material containing elemental Ta; and an atomic layer deposition film 13 disposed on at least part of a surface 12a of the undercoat layer 12.

With this configuration, a period of time from the start of forming process of the atomic layer deposition film 13 to the formation of dense film by two dimensional growth becomes shorter than the conventional period of time, in other words, the undercoat layer 12 does not have spaces which correspond to a free volume of the substrate 11 and the precursors which are raw material for deposition are difficult to enter the spaces. Accordingly, a dense portion formed by two dimensional growth in the atomic layer deposition film can be increased even if the thickness of the atomic layer deposition film 13 is reduced (for example, in the range of 0.5 nm or more and 200 nm or less), and thus sufficient gas barrier properties can be obtained even if the thickness of the atomic layer deposition film 13 is reduced.

Further, since the atomic layer deposition film 13 has sufficient gas barrier properties, the laminate 10 with high gas barrier properties can be obtained.

<Gas Barrier Film>

The gas barrier film (not shown) includes the laminate 10 shown in FIG. 1, and the substrate 11 which constitutes the laminate 10 is a film-shaped substrate.

The gas barrier film (not shown) may be formed only by the laminate 10, or may be provided with a protective layer for protecting the atomic layer deposition film 13 (specifically, for example, a layer containing the same inorganic material as that of the undercoat layer 12, a layer containing an organic material, or a structure on which a plastic film is laminated) disposed on the surface 13a of the atomic layer deposition film 13 which is disposed on the outermost layer of the laminate 10.

The gas barrier film (not shown) having the above configuration is used in various fields such as food packaging, pharmaceutical products, electronics, and agricultural materials.

The water vapor transmission rate of the laminate 10 is preferably, for example, 0.1 g/(m$^2$·day) or less. When the water vapor transmission rate of the laminate 10 is more than 0.1 g/(m$^2$·day), the laminate 10 can be used for food packaging, but cannot protect electronics which may degenerate on exposure to a slight amount of water. Accordingly, for use as a protective layer of electronics, which is one of the applications of the present invention, the laminate 10 should have the water vapor transmission rate of 0.1 g/(m$^2$·day) or less. By using the laminate 10 of the above configuration, the water vapor transmission rate of the laminate 10 may be stably set at 0.1 g/(m$^2$·day) or less.

According to the gas barrier film (not shown) having the above configuration, the same effects as those of the laminate 10 described above can be obtained.

<Production Method of Laminate>

Next, with reference to FIG. 1, a method of producing the laminate 10 of the present embodiment will be described.

First, the undercoat layer 12 is formed on at least part of the surface 11a of the substrate 11 made of a polymer material (step of forming undercoat layer).

The undercoat layer 12 may be formed by various methods such as PVD (for example, induction heating, resistance heating, electron beam vapor deposition or sputtering), CVD (for example, heat CVD, plasma CVD or optical CVD) and the like. Note that, the method for producing the undercoat layer 12 is not limited to the above methods, and may be ion plating, laser ablation, molecular beam epitaxy or the like.

Here, a specific method of producing the undercoat layer 12 will be described using an example of forming the undercoat layer 12 containing $Ta_2O_5$.

First, the substrate 11 on which the undercoat layer 12 is not formed is fixed to a stage in the vacuum chamber (not shown).

Then, a pressure (pre-deposition pressure) in the vacuum chamber is set to, for example, $5 \times 10^{-4}$ Pa.

Then, for example, Ar is introduced into the deposition chamber at 30 sccm, and $O_2$ is introduced at 10 sccm. After the pressure (pressure during deposition) in the vacuum chamber is set to $2.5 \times 10^{-1}$ Pa, the undercoat layer 12 containing $Ta_2O_5$ is formed on at least part of the surface 11a of the substrate 11 by sputtering.

Then, precursors which are raw materials of deposition are supplied onto the surface 12a of the undercoat layer 12 to form the atomic layer deposition film 13 on at least part of the surface 12a of the undercoat layer 12 (step of forming atomic layer deposition film).

That is, in the step of forming the atomic layer deposition film, the atomic layer deposition film 13 is formed by using atomic layer deposition (ALD). Thus, the laminate 10 is produced.

Specifically, when an $Al_2O_3$ layer is formed as the atomic layer deposition film 13, the following method can be used.

First, the substrate 11 on which the undercoat layer 12 is formed is fixed to a stage in the deposition chamber (not shown) of an atomic layer deposition film forming apparatus (not shown).

Then, after the pressure (pressure during deposition) in the deposition chamber is set to 0.5 Pa, gas serving as a reactive gas and a discharge gas (for example, at least one of $O_2$ and $N_2$) is introduced into the deposition chamber to supply the gas serving as a reactive gas and a discharge gas onto the surface 12a of the undercoat layer 12 (Step 1).

The pressure inside the deposition chamber may be appropriately set, for example, in the range between 10 and 50 Pa.

Further, a power supply for plasma gas excitation may be, for example, a power supply at 13.56 MHz.

Then, plasma discharge is performed on an inductively coupled plasma (ICP) mode in the deposition chamber (Step 2).

An output power supply for plasma discharge may use, for example, 250 W.

After the above plasma discharge, the deposition chamber is purged with gas (Step 3). Gas used for the gas purge may be, for example, $O_2$, $N_2$ or the like. Further, a reaction temperature during the gas purge may be, for example, 90° C.

Then, tri-methyl aluminum (TMA), which was a raw material for deposition (precursor) and a purge gas (for example, $N_2$ and $O_2$) were simultaneously supplied into the deposition chamber (Step 4).

Then, the gas serving as a reactive gas and a discharge gas (for example, $O_2$) is supplied into the deposition chamber (Step 5). The pressure inside the deposition chamber may be a predetermined pressure, for example, in the range between 10 and 50 Pa.

Subsequently, plasma discharge is conducted in the deposition chamber in the inductively coupled plasma (ICP) mode (Step 6) to form an $Al_2O_3$ layer of a single-atom layer (part of the atomic layer deposition film 13) on the surface 12a on the undercoat layer 12. A power supply for plasma gas excitation used in this process may be, for example, a power supply at 13.56 MHz.

The processes described above from Step 1 to Step 6 are taken as one cycle, and the cycle is repeated a plurality of times to form the atomic layer deposition film 13 made of the $Al_2O_3$ layer.

In the step of forming the atomic layer deposition film, the atomic layer deposition film 13 is preferably formed to have the thickness in the range of, for example, 0.5 nm or more and 200 nm or less.

When the thickness of the atomic layer deposition film 13 is less than 0.5 nm, the atomic layer deposition film 13 does not have sufficient water vapor barrier properties from a view of manufacturing technology. When the thickness of the atomic layer deposition film 13 is over 200 nm, the cost and time for film deposition increase, which is not desirable.

Accordingly, when the thickness of the atomic layer deposition film 13 is in the range of 0.5 nm or more and 200 nm or less, the atomic layer deposition film 13 with sufficient water vapor barrier properties can be formed in a short period of time.

Moreover, subsequent to the step of forming undercoat layer, the surface 12a of the undercoat layer 12 may be processed with a surface treatment (for example, plasma treatment (plasma etching treatment), corona treatment or alkali treatment) so as to increase the density of the adsorption sites.

The method of producing a laminate according to the present embodiment includes the steps of: forming the undercoat layer 12 by using an inorganic material containing elemental Ta on at least part of the surface 11a of the substrate 11 made of a polymer material disposed in the vacuum chamber (not shown); and forming the atomic layer deposition film 13 by supplying precursors serving as raw materials for deposition on at least part of the surface 12a of the undercoat layer 12.

With this configuration, a period of time from the start of forming process of the atomic layer deposition film 13 to the formation of dense film by two dimensional growth becomes shorter than the conventional period of time, in other words, the precursors are difficult to enter the spaces of the free volume. Accordingly, a dense portion formed by two dimensional growth in the atomic layer deposition film can be increased even if the thickness of the atomic layer deposition film 13 is reduced (for example, 0.5 nm less), and thus sufficient gas barrier properties can be obtained even if the thickness of the atomic layer deposition film 13 is reduced.

Further, since the atomic layer deposition film 13 has sufficient gas barrier properties, the laminate 10 with high gas barrier properties can be obtained.

<Production Method of Gas Barrier Film>

The method of producing the gas barrier film (not shown) varies depending on the configuration of the gas barrier film. When the gas barrier film has the same configuration as that of the laminate 10 shown in FIG. 1, the gas barrier film can be produced by the same method as that of the aforementioned laminate 10.

Further, when the gas barrier film is configured to further include a protective layer (not shown) for protecting a top surface (surface) 13a of the atomic layer deposition film 13 in addition to the configuration of the laminate 10 shown in FIG. 1, the gas barrier film can be produced by the same method as that of the aforementioned laminate 10 except for including the step of forming the protective layer (specifically, for example, a layer containing the same inorganic material as that of the undercoat layer 12, a layer containing an organic material, or a structure on which a plastic film is laminated) subsequent to the step of forming the atomic layer deposition film.

The protective layer may be formed, for example, by means of PVD or CVD if containing an inorganic material, or may be formed by means of bar coating or spin coating if containing an organic material.

Further, in production of a gas barrier film, a film-shaped substrate is used for the substrate 11.

According to the method of producing a gas barrier film (not shown), the same effect as that of the method of producing the laminate 10 described above can be obtained.

Example 1

Test examples, Examples, and Comparative Examples of the present invention will be described below. However, the present invention is not limited in any way by the following examples.

<Production of Laminate of Example 1>

With reference to FIG. 1, a method of producing the laminate of Example 1 will be described.

First, a $Ta_2O_5$ layer having the thickness of 20 nm was formed as the undercoat layer 12 by sputtering on the surface 11a of the substrate 11 made of a polyethylene terephthalate (PET) film (model No. A4100, manufactured by Toyobo Co., Ltd.) having the thickness of 100 µm. The pre-deposition pressure was $5 \times 10^{-4}$ Pa. During deposition, Ar was introduced into a deposition chamber at 30 sccm, and $O_2$ was introduced at 10 sccm. The pressure during deposition was $2.5 \times 10^{-1}$ Pa. A Ta target was used as a sputtering target, and film deposition was performed at constant power of 300 W. Here, the voltage was 610 V, electric current was 0.51 A, rotation speed of the stage was 6 rpm, and target-stage distance was 200 mm.

Then, an $Al_2O_3$ layer with the thickness of 0.7 nm was formed as the atomic layer deposition film 13 on the surface 12a of the undercoat layer 12 by means of ALD.

Specifically, the $Al_2O_3$ layer with the thickness of 0.7 nm was formed by the following steps.

First, $O_2$ was supplied as gas serving as a reactive gas and a discharge gas onto the surface 12a of the undercoat layer 12 which is housed in the deposition chamber after the pressure (pre-deposition pressure) was set at 0.5 Pa (Step 1). The pressure inside the deposition chamber was 40 Pa. A power supply at 13.56 MHz was used as a power supply for plasma gas excitation. Plasma discharge in the ICP mode was conducted for 60 seconds (Step 2).

An output power supply for plasma discharge was 250 W.

After the plasma discharge, the deposition chamber was purged with gas (Step 3). In the gas purge, $O_2$ and $N_2$ were supplied as a purge gas for ten seconds. The reaction temperature was 90° C.

Then, tri-methyl aluminum (TMA), which was a raw material for deposition (precursor) and a purge gas (for example, $N_2$ and $O_2$) were simultaneously supplied into the deposition chamber (Step 4).

Then, the purge gas (for example, $N_2$ and $O_2$) was supplied into the deposition chamber (Step 5).

$O_2$ was supplied as a reactive gas and discharge gas and plasma discharge was conducted in the ICP mode in the deposition chamber (Step 6) to form an $Al_2O_3$ layer of a single-atom layer (part of the atomic layer deposition film 13) on the surface 12a of the undercoat layer 12. A power supply at 13.56 MHz was used as a power supply for plasma gas excitation. The pressure inside the deposition chamber was 40 Pa.

Then, the purge gas (for example, $N_2$ and $O_2$) was supplied into the deposition chamber (Step 7).

The above Steps 4 to 7 were taken as one cycle, and the cycle was repeated 5 times to form an $Al_2O_3$ layer (the atomic layer deposition film 13) with a thickness of 0.7 nm.

Thus, a laminate of Example 1 was produced.

<Production of Laminate of Example 2>

With reference to FIG. 1, a method of producing the laminate of Example 2 will be described.

In Example 2, the laminate of Example 2 was produced by the same method as that of the laminate of Example 1 except for the thickness of the atomic layer deposition film 13 which constitutes the laminate of Example 1 being changed to 10 nm.

<Production of Laminate of Comparative Example 1>

In Comparative Example 1, an $Al_2O_3$ layer with a thickness of 0.7 nm was formed as the atomic layer deposition film 13 directly on the surface 11a of the substrate 11 made of a polyethylene terephthalate (PET) film with a thickness of 100 µm (model No. A4100, manufactured by Toyobo Co., Ltd.) by the same method as Example 1 (ALD process) without performing the step of forming the undercoat layer 12 (see FIG. 1) performed in Example 1.

Thus, the laminate of Comparative Example 1 was produced.

<Production of Laminate of Comparative Example 2>

In Comparative Example 2, a $SiO_{1.6}$ layer having the thickness of 20 nm was first formed as the undercoat layer 12 by electron beam vapor deposition on the surface 11a of the substrate 11 made of a polyethylene terephthalate (PET) film (model No. A4100, manufactured by Toyobo Co., Ltd.) having the thickness of 100 µm. The pre-deposition pressure was $4 \times 10^{-3}$ Pa, and the pressure during deposition was $2 \times 10^{-2}$ Pa.

Then, an $Al_2O_3$ layer having the thickness of 0.7 nm was formed as the atomic layer deposition film 13 by the same method as Example 1 (ALD process).

Thus, the laminate of Comparative Example 2 was produced.

<Production of Laminate of Comparative Example 3>

In Comparative Example 3, an $Al_2O_3$ layer with a thickness of 10 nm was formed as the atomic layer deposition film 13 directly on the surface 11a of the substrate 11 made of a polyethylene terephthalate (PET) film with a thickness of 100 µm (model No. A4100, manufactured by Toyobo Co., Ltd.) by the same method as Example 2 (ALD process) without performing the step of forming the undercoat layer 12 (see FIG. 1) performed in Example 2.

Thus, the laminate of Comparative Example 3 was produced.

<Production of Laminate of Comparative Example 4>

In Comparative Example 4, a $Ta_2O_5$ layer with a thickness of 20 nm was formed as the undercoat layer 12 directly on the surface 11a of the substrate 11 made of a polyethylene terephthalate (PET) film with a thickness of 100 µm (model No. A4100, manufactured by Toyobo Co., Ltd.) without performing the step of forming the atomic layer deposition film 13 (see FIG. 1) performed in Example 1 or 2.

Thus, the laminate of Comparative Example 4 was produced.

<Production of Laminate of Comparative Example 5>

In Comparative Example 5, a $SiO_{1.6}$ layer with a thickness of 20 nm was formed as the undercoat layer 12 directly on the surface 11a of the substrate 11 made of a polyethylene terephthalate (PET) film with a thickness of 100 µm (model No. A4100, manufactured by Toyobo Co., Ltd.) without performing the step of forming the atomic layer deposition film 13 (see FIG. 1) performed in Example 2.

Thus, the laminate of Comparative Example 5 was produced.

<Measurement of Water Vapor Transmission Rate of Laminate in Example 1 and Comparative Examples 1 to 5>

Next, for evaluation of water vapor barrier properties of the laminates of Example 1 and Comparative Examples 1 to 5, the water vapor transmission rate (WVTR) was measured in the atmosphere of 40° C./90% RH by using a water vapor transmission rate measurement apparatus (MOCON Permatran (registered trademark), manufactured by Mocon, Inc.).

<Measurement of Water Vapor Transmission Rate of Laminate in Example 2>

Next, for evaluation of water vapor barrier properties of Example 2, the water vapor transmission rate (WVTR) was measured in the atmosphere of 40° C./90% RH by using a water vapor transmission rate measurement apparatus (MOCON Aquatran (registered trademark), manufactured by Mocon, Inc.).

Table 1 shows the results from Examples 1 and 2 and Comparative Examples 1 to 5.

TABLE 1

| | Undercoat Layer | Film Thickness of $Al_2O_3$ Atomic Layer Deposition Film [nm] | Water Vapor Transmission Rate [g/(m² · day)] |
|---|---|---|---|
| Example 1 | $Ta_2O_5$ | 0.7 | <0.02 |
| Example 2 | $Ta_2O_5$ | 10 | 0.003 |
| Comparative Example 1 | None | 0.7 | 5.4 |
| Comparative Example 2 | $SiO_{1.6}$ | 0.7 | 0.30 |
| Comparative Example 3 | None | 10 | 0.12 |
| Comparative Example 4 | $Ta_2O_5$ | None | 0.58 |
| Comparative Example 5 | $SiO_{1.6}$ | None | 1.05 |

Evaluation Results of Example 1 and Comparative Examples 1 and 2

Referring to Table 1, in the laminate of Comparative Example 1 which does not include the undercoat layer 12, the water vapor transmission rate was 5.4 g, which showed that the water vapor barrier properties were low. In the laminate of Comparative Example 2 in which a $SiO_{1.6}$ layer was formed as the undercoat layer 12, the water vapor transmission rate was 0.3 g, which showed a certain level of water vapor barrier properties. However, good water vapor barrier properties with the water vapor transmission rate of 0.1 g or less were not achieved.

On the other hand, in the laminates of Example 1, the water vapor transmission rate was <0.02 [g/(m²·day)]. Accordingly, it was confirmed that even the $Al_2O_3$ layer (atomic layer deposition film 13) having an extremely small thickness of 0.7 nm has good water vapor barrier properties.

Evaluation Results of Example 2 and Comparative Example 3

Referring to Table 1, in the laminate of Comparative Example 3 which does not include the undercoat layer 12, the water vapor transmission rate was 0.12 g. On the other hand, in the laminate of Example 2, the water vapor transmission rate was 0.003 [g/(m2·day)], which showed good water vapor barrier properties.

Evaluation Results of Comparative Examples 4 and 5

Referring to Table 1, in the laminate of Comparative Example 4 which does not include the atomic layer deposition film 13, the water vapor transmission rate was 0.58 g. Further, in the laminate of Comparative Example 5, the water vapor transmission rate was 1.05 g. Both are regarded as having the water vapor barrier properties due to the undercoat layer 12. However, good water vapor barrier properties with the water vapor transmission rate of 0.1 g or less were not achieved.

CONCLUSION

As described above, according to the laminate of the present invention, the water vapor transmission rate is significantly decreased by using an inorganic material containing elemental Ta as the undercoat layer 12 compared with the case where only the atomic layer deposition film 13 is used and the case where an inorganic material which does not contain elemental Ta is used as the undercoat layer 12. Accordingly, the laminate having high water vapor barrier properties can be obtained.

However, the specific configuration of the present invention is not limited to the details of the aforementioned embodiments, and modifications of design without departing from the principle of the present invention would be encompassed by the present invention.

Although the description has been made with reference to a limited number of embodiments, the scope of the invention is not limited thereto, and modifications of the above embodiments on the basis of the above disclosure is obvious to a person having ordinary skill in the art. That is, the present invention may not be limited to the aforementioned embodiments. Design modifications or the like can also be made to the above embodiments on the basis of a knowledge of a skilled person in the art, and such modifications or the like are encompassed within the scope of the present invention.

INDUSTRIAL APPLICABILITY

The present invention can be applied to a laminate which includes a substrate made of a polymer material, an undercoat layer disposed on the surface of the substrate, and an atomic layer deposition film disposed on the surface of the undercoat layer, and a method of producing the same, and a gas barrier film and a method of producing the same. The laminate of the present invention can be used for electronics such as electroluminescence elements (EL elements), liquid crystal displays, and semiconductor wafers.

REFERENCE SIGNS LIST 10 laminate, 11 substrate, 11a surface, 12 undercoat layer, 12a surface, 13 atomic layer deposition film, 13a surface

What is claimed is:

1. A packaged product, which is a product packaged in a packaging material, the packaging material is a laminate, the laminate consists of:
   a polymer substrate;
   a tantalum oxide undercoat layer on the substrate; and,
   a single atomic layer deposition film on the tantalum oxide undercoat layer, the single atomic layer deposition film consists of aluminum oxide, wherein a water vapor transmission rate of the packaging material measured in the atmosphere of 40° C./90% relative humidity is in a range of 0.1 g/(m²·day) or less.

2. The packaged product of claim 1, wherein the thickness of the tantalum oxide undercoat layer is in a range of 1 nm or more and 1000 nm or less.

3. The packaged product of claim 1, where the thickness of the single atomic layer deposition film is in a range of 0.5 nm or more and 200 nm or less.

4. The packaged product of claim 1, wherein the polymer substrate is a film-shaped substrate.

5. The packaged product of claim 1, wherein the product is a food product, a pharmaceutical product, an electronic product, or an agricultural material.

6. The packaged product of claim 1, wherein a thickness of the single atomic layer deposition layer is from 0.5 nm to 10 nm.

7. The packaged product of claim 1, wherein a thickness of the single atomic layer deposition layer is from 0.5 nm to 0.7 nm.

* * * * *